(12) United States Patent
Lee

(10) Patent No.: US 8,766,708 B2
(45) Date of Patent: Jul. 1, 2014

(54) SEMICONDUCTOR DEVICE AND OPERATING METHOD THEREOF

(75) Inventor: Jun-Gyu Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 67 days.

(21) Appl. No.: 13/525,805

(22) Filed: Jun. 18, 2012

(65) Prior Publication Data

US 2013/0147546 A1 Jun. 13, 2013

(30) Foreign Application Priority Data

Dec. 8, 2011 (KR) ........................ 10-2011-0130951

(51) Int. Cl.
*G05F 1/10* (2006.01)

(52) U.S. Cl.
USPC .......................................... 327/540; 327/543

(58) Field of Classification Search
USPC ........................................................ 327/540
See application file for complete search history.

(56) References Cited

U.S. PATENT DOCUMENTS

| | | | | |
|---|---|---|---|---|
| 5,302,888 A | * | 4/1994 | Hellums et al. | 323/280 |
| 5,311,145 A | * | 5/1994 | Huijsing et al. | 330/255 |
| 5,880,624 A | * | 3/1999 | Koyanagi et al. | 327/541 |
| 7,176,752 B2 | * | 2/2007 | Hashimoto et al. | 327/541 |
| 7,265,607 B1 | * | 9/2007 | Rajapandian et al. | 327/541 |
| 7,821,863 B2 | * | 10/2010 | Takeuchi | 365/226 |
| 7,961,037 B2 | * | 6/2011 | Yano | 327/540 |
| 8,184,083 B2 | * | 5/2012 | Chung | 345/98 |
| 8,542,222 B2 | * | 9/2013 | Nishimura et al. | 345/204 |
| 2005/0057232 A1 | * | 3/2005 | Tam et al. | 323/268 |
| 2005/0242791 A1 | * | 11/2005 | Rajapandian et al. | 323/268 |
| 2006/0066400 A1 | * | 3/2006 | Kang et al. | 330/255 |
| 2012/0032939 A1 | * | 2/2012 | Tsuchi | 345/211 |

FOREIGN PATENT DOCUMENTS

| | | |
|---|---|---|
| KR | 1019970017150 | 4/1997 |
| KR | 100336760 | 5/2002 |

* cited by examiner

*Primary Examiner* — Thomas J Hiltunen
(74) *Attorney, Agent, or Firm* — IP & T Group LLP

(57) ABSTRACT

A semiconductor device includes an internal voltage input buffer configured to determine voltage levels of a pull-up driving node and a pull-down driving node as a result of a comparison between a voltage level of an internal voltage node and a voltage level of a reference voltage node such that the pull-up driving node and the pull-down driving node to maintain a voltage level difference, and an internal voltage driving block configured to pull-up drive the internal voltage node in response to the voltage level of the pull-up driving node and pull-down drive the internal voltage node in response to the voltage level of the pull-down driving node.

20 Claims, 8 Drawing Sheets

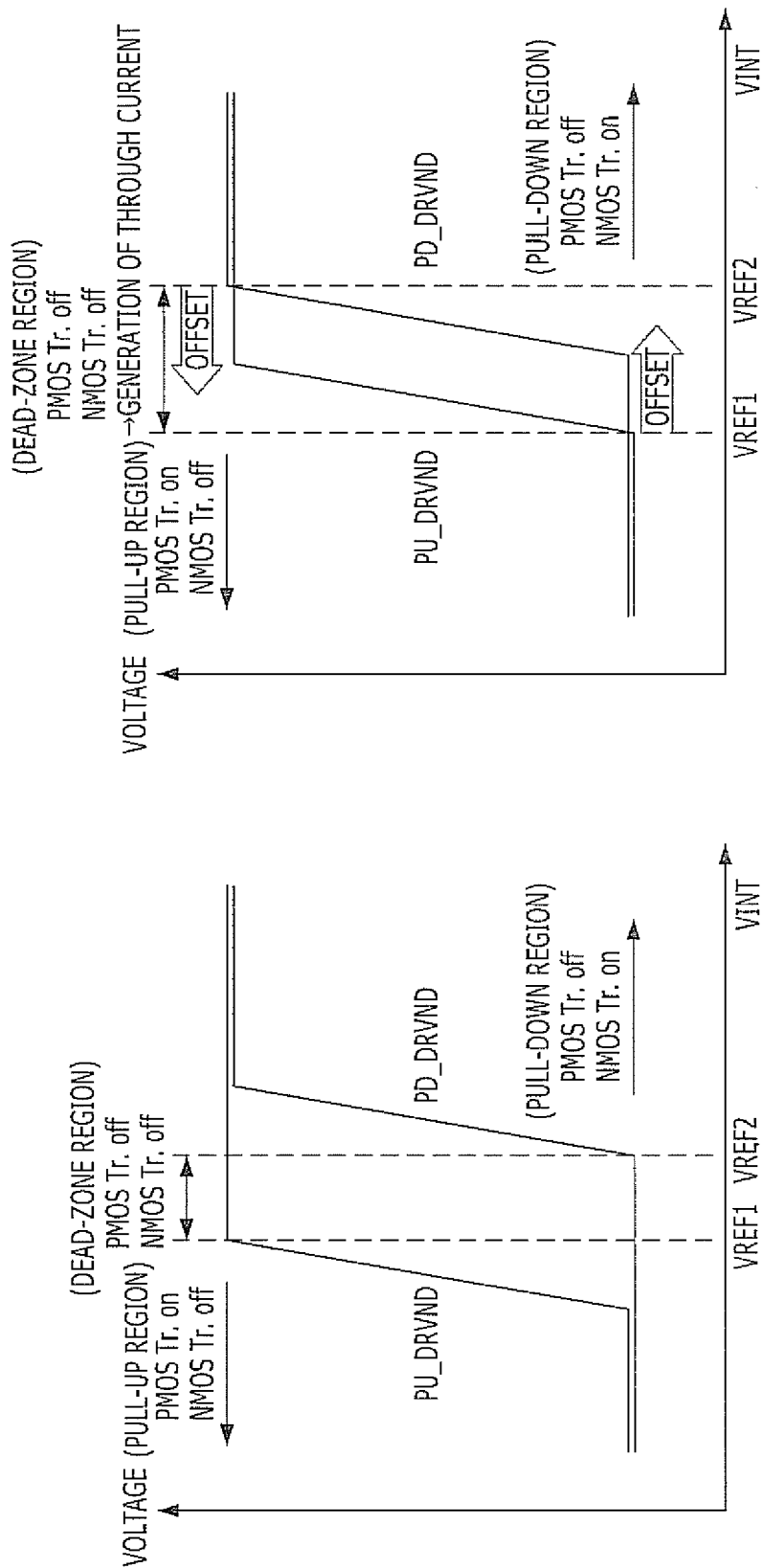

SEMICONDUCTOR DEVICE AND OPERATING METHOD THEREOF

CROSS-REFERENCE TO RELATED APPLICATIONS

The present application claims priority of Korean Patent Application No. 10-2011-0130951, filed on Dec. 8, 2011, which is incorporated herein by reference in its entirety.

BACKGROUND

1. Field

Exemplary embodiments of the present invention relate to a semiconductor design technology, to an internal voltage generation circuit of a semiconductor device, and an operating method thereof, and more particularly, to an internal voltage generation circuit of a semiconductor device that does not include a dead zone operating region and an operating method thereof.

2. Description of the Related Art

As a critical dimension and a cell size of a semiconductor device are reduced, a power supply voltage is also reduced, and accordingly, a design technology for low voltage circumstances is useful.

For example, a semiconductor device includes an internal voltage generation circuit that receives a power supply voltage (VDD) and generates internal voltages to provide to internal circuits of a semiconductor device.

FIG. 1 is a circuit diagram illustrating a conventional internal voltage generation circuit of a semiconductor device.

Referring to FIG. 1, a conventional internal voltage generation circuit of a semiconductor device includes a first internal voltage input buffer 100, a second internal voltage input buffer 120, and an internal voltage driving block 140.

The first internal voltage input buffer 100 is configured to determine a voltage level of a pull-up driving node PU_DRVND as a result of a comparison between a voltage level of an internal voltage (VINT) node and a voltage level of a first reference voltage (VREF1) node.

The second internal voltage input buffer 200 is configured to determine a voltage level of a pull-down driving node PD_DRVND as a result of a comparison between a voltage level of the internal voltage (VINT) node and a voltage level of a second reference voltage (VREF2) node.

The internal voltage driving block 140 is configured to pull-up drive the internal voltage (VINT) node in response to the voltage level of the pull-up driving node PU_DRVND and pull-down drive the internal voltage (VINT) node in response to the voltage level of the pull-down driving node PD_DRVND.

In the conventional internal voltage generation circuit of a semiconductor device, the voltage level of the internal voltage (VINT) node is determined in response to a PMOS transistor DP1 for pull-up driving the internal voltage (VINT) node and an NMOS transistor DN1 for pull-down driving the internal voltage (VINT) node. In many cases, the voltage level of the internal voltage (VINT) node is determined to a voltage level corresponding to an intermediate value between the voltage level of the first reference voltage (VREF1) node and the voltage level of the second reference voltage (VREF2) node.

FIGS. 2A and 2B are graphs illustrating operations of the conventional internal voltage generation circuit of a semiconductor device shown in FIG. 1.

Referring to FIG. 2A, operations of the conventional internal voltage generation circuit of a semiconductor device are divided into three regions depending upon the voltage level of the internal voltage (VINT) node.

In detail, in a pull-up region where the voltage level of the internal voltage (VINT) node is lower than the voltage level of the first reference voltage (VREF1) node, the PMOS transistor DP1 for pull-up driving the internal voltage (VINT) node is turned on such that current from a power supply voltage (VDD) terminal is provided to the internal voltage (VINT) node. Accordingly, the voltage level of the internal voltage (VINT) node rises. In the pull-up region, the NMOS transistor DN1 for pull-down driving the internal voltage (VINT) node is turned off such that current does not flow from the internal voltage (VINT) node to a ground voltage (VSS) terminal.

In a pull-down region where the voltage level of the internal voltage (VINT) node is higher than the voltage level of the second reference voltage (VREF2) node, the NMOS transistor DN1 for pull-down driving the internal voltage (VINT) node is turned on such that current flows from the internal voltage (VINT) node to the ground voltage (VSS) terminal. Accordingly, the voltage level of the internal voltage (VINT) node falls. In the pull-down region, the PMOS transistor DP1 for pull-up driving the internal voltage (VINT) node is turned off such that current is not provided from the power supply voltage (VDD) terminal to the internal voltage (VINT) node.

In a dead zone region where the voltage level of the internal voltage (VINT) node is higher than the voltage level of the first reference voltage (VREF1) node and lower than the voltage level of the second reference voltage (VREF2) node, the NMOS transistor DN1 for pull-down driving the internal voltage (VINT) node is turned off such that current does not flow from the internal voltage (VINT) node to the ground voltage (VSS) terminal, and simultaneously, the PMOS transistor DP1 for pull-up driving the internal voltage (VINT) node is turned off such that current does not flow from the power supply voltage (VDD) terminal to the internal voltage (VINT) node. More specifically, the internal voltage driving block 140 does not perform any operation in the dead zone region, and no current flows from the power supply voltage (VDD) to the internal voltage (VINT) node, and no current flows from the internal voltage (VINT) node to the ground voltage (VSS).

Referring to FIG. 2B, some of the exemplary issues of the conventional internal voltage generation circuit are illustrated.

In detail, as described above with reference to FIG. 2A, in the conventional internal voltage generation circuit, the internal voltage driving block 140 does not perform any operation in the dead zone region. The substantial size of the dead zone region means that the internal voltage driving block 140 does not perform any operation for an increased amount of time. Thus, in order to improve the operation reaction speed of the first and second internal voltage input buffers 100 and 120, the size of the dead zone region is to be reduced.

However, referring to FIG. 2B, due to offset operations of the first and second internal voltage input buffers 100 and 120, both the NMOS transistor DN1 for pull-down driving the internal voltage (VINT) node and the PMOS transistor DP1 for pull-up driving the internal voltage (VINT) node may be turned on such that through current is produced.

Summarizing this, where the offset operations are not caused in the first and second internal voltage input buffers 100 and 120 as shown in FIG. 2A, since both the NMOS transistor DN1 for pull-down driving the internal voltage (VINT) node and the PMOS transistor DP1 for pull-up driving the internal voltage (VINT) node are turned off in the dead zone region, the through current is not produced.

However, as shown in FIG. 2B, if the first and second internal voltage input buffers 100 and 120 perform the offset operations, a phenomenon may occur where there are periods in which the voltage levels of the pull-up driving node PU_DRVND and the pull-down driving node PD_DRVND overlap with each other as the voltage levels of the pull-up driving node PU_DRVND and the pull-down driving node PD_DRVND shift toward each other. In this regard, in the event that the voltage level of the internal voltage (VINT) node corresponds to one half of the voltage level of a power supply voltage VDD, both the NMOS transistor DN1 for pull-down driving the internal voltage (VINT) node and the PMOS transistor DP1 for pull-up driving the internal voltage (VINT) node are turned on, and a through current phenomenon occurs in which a large amount of current flows from the power supply voltage (VDD) terminal through the PMOS transistor DP1 and the NMOS transistor DN1 to the ground voltage (VSS) terminal.

If the through current phenomenon occurs in this way, current use of a semiconductor device abruptly increases, and as a result, the power consumption of the semiconductor device increases. Therefore, in the conventional art, the dead zone region equal to or greater than several tens of mV is maintained.

As a consequence, due to the presence of the dead zone region, the reaction speed of the internal voltage generation circuit is substantially slowed down, and the performance of the semiconductor device may deteriorate.

SUMMARY

An embodiment of the present invention is directed to an internal voltage generation circuit of a semiconductor device in which a dead zone operating region does not exist.

In accordance with an embodiment of the present invention, a semiconductor device includes: an internal voltage input buffer configured to determine voltage levels of a pull-up driving node and a pull-down driving node as a result of a comparison between a voltage level of an internal voltage node and a voltage level of a reference voltage node such that the pull-up driving node and the pull-down driving node to maintain a voltage level difference; and an internal voltage driving block configured to pull-up drive the internal voltage node in response to the voltage level of the pull-up driving node and pull-down drive the internal voltage node in response to the voltage level of the pull-down driving node.

In accordance with another embodiment of the present invention, a semiconductor device includes: a first internal voltage input buffer configured to determine voltage levels of a first pull-up driving node and a first pull-down driving node by comparing a voltage level of an internal voltage node and a voltage level of a first reference voltage node such that the first pull-up driving node and the first pull-down driving node maintain a voltage level difference; a second internal voltage input buffer configured to determine a voltage level of a second pull-up driving node by comparing the voltage level of the internal voltage node and a voltage level of a second reference voltage node; a third internal voltage input buffer configured to determine a voltage level of a second pull-down driving node by comparing the voltage level of the internal voltage node and a voltage level of a third reference voltage node; and an internal voltage driving block configured to pull-up drive the internal voltage node in response to the respective voltage levels of the first pull-up driving node and the second pull-up driving node and pull-down drive the internal voltage node in response to the respective voltage levels of the first pull-down driving node and the second pull-down driving node.

In accordance with yet another embodiment of the present invention, a method for operating a semiconductor device includes: raising simultaneously voltage levels of a pull-up driving node and a pull-down driving node in response to a voltage level of an internal voltage node that becomes higher than a level of a reference voltage node such that a voltage level difference is maintained; lowering simultaneously the voltage levels of the pull-up driving node and the pull-down driving node in response to the voltage level of the internal voltage node that becomes lower than the level of the reference voltage node such that the voltage level difference is maintained; pull-up driving the internal voltage node with a driving force in response to the voltage level of the pull-up driving node; and pull-down driving the internal voltage node with the driving force in response to the voltage level of the pull-down driving node.

In accordance with still another embodiment of the present invention, a method for operating a semiconductor device includes: changing simultaneously voltage levels of a first pull-up driving node and a first pull-down driving node by comparing a voltage level of an internal voltage node and a voltage level of a first reference voltage node such that a voltage level difference is maintained; changing a voltage level of a second pull-up driving node by comparing the voltage level of the internal voltage node and a voltage level of a second reference voltage node; changing a voltage level of a second pull-down driving node by comparing the voltage level of the internal voltage node and a voltage level of a third reference voltage node; pull-up driving the internal voltage node in response to the voltage levels of the first and second pull-up driving nodes; and pull-down driving the internal voltage node in response to the voltage levels of the first and second pull-down driving nodes.

BRIEF DESCRIPTION OF THE DRAWINGS

FIGS. 2A and 2B are graphs illustrating operations of the conventional internal voltage generation circuit of a semiconductor device shown in FIG. 1.

DETAILED DESCRIPTION

Figure 1:
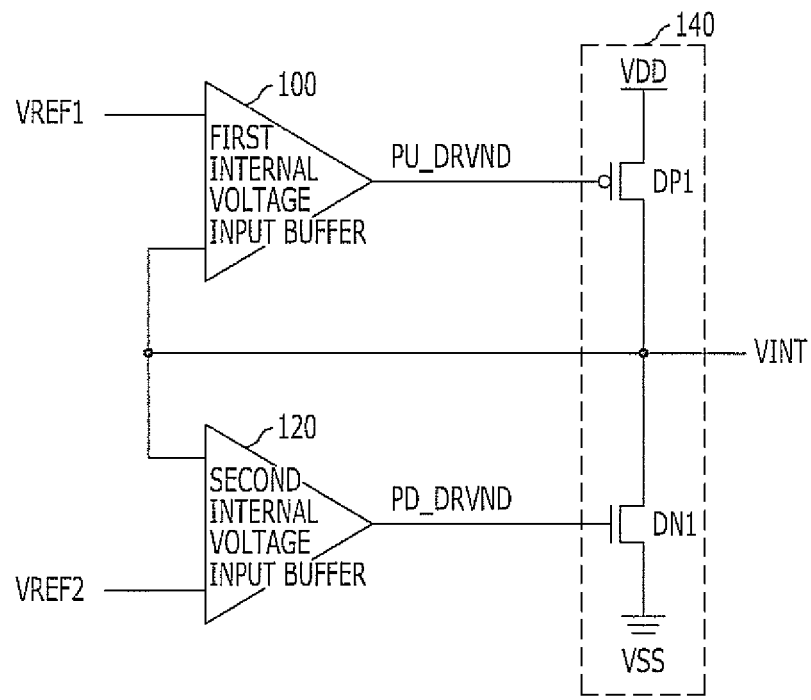
FIG. 1 is a circuit diagram illustrating a conventional internal voltage generation circuit of a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

<First Embodiment>

Figure 3A:
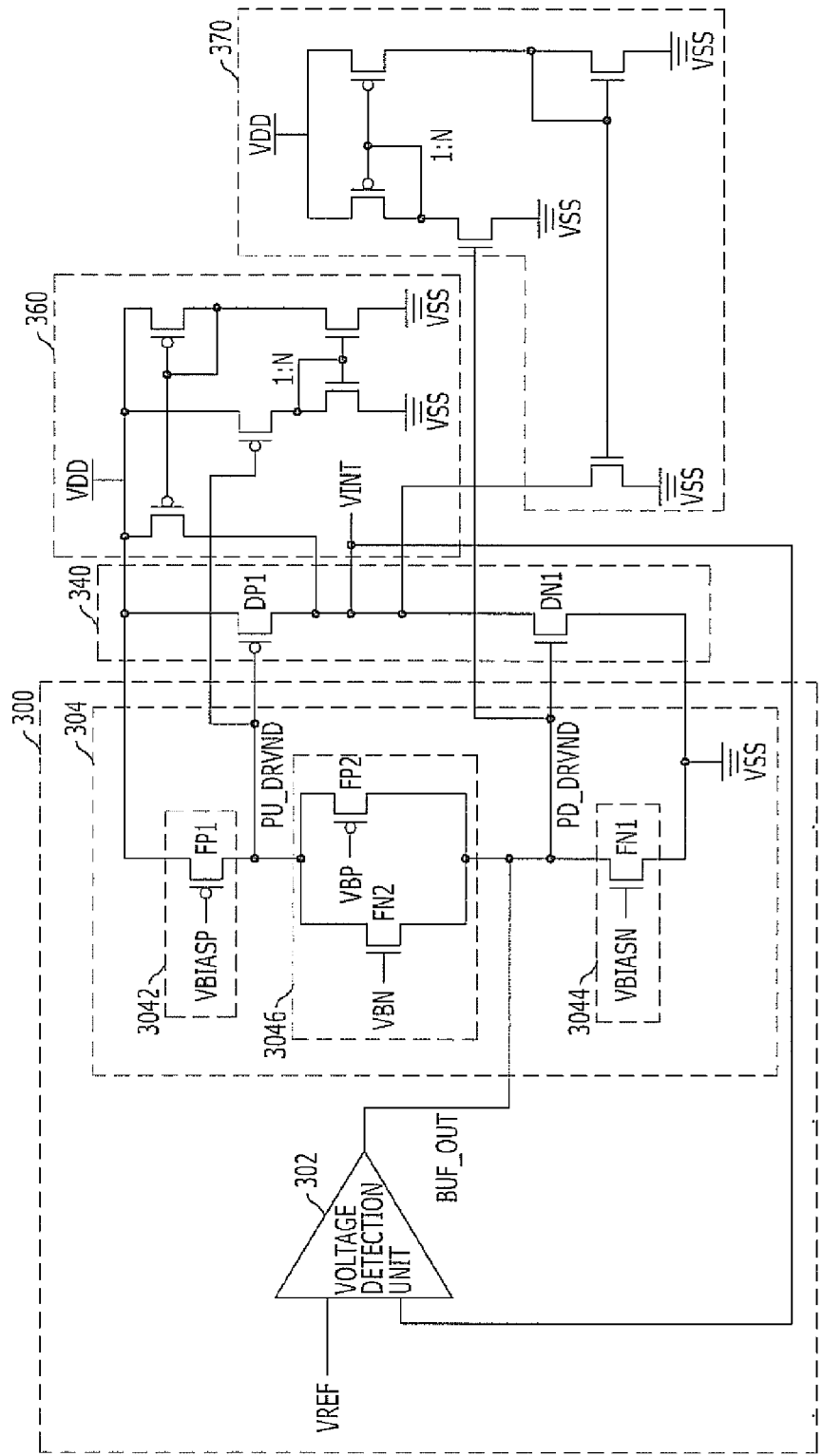
FIGS. 3A and 3B are circuit diagrams illustrating an internal voltage generation circuit of a semiconductor device in accordance with a first embodiment of the present invention.
Figure 3B:
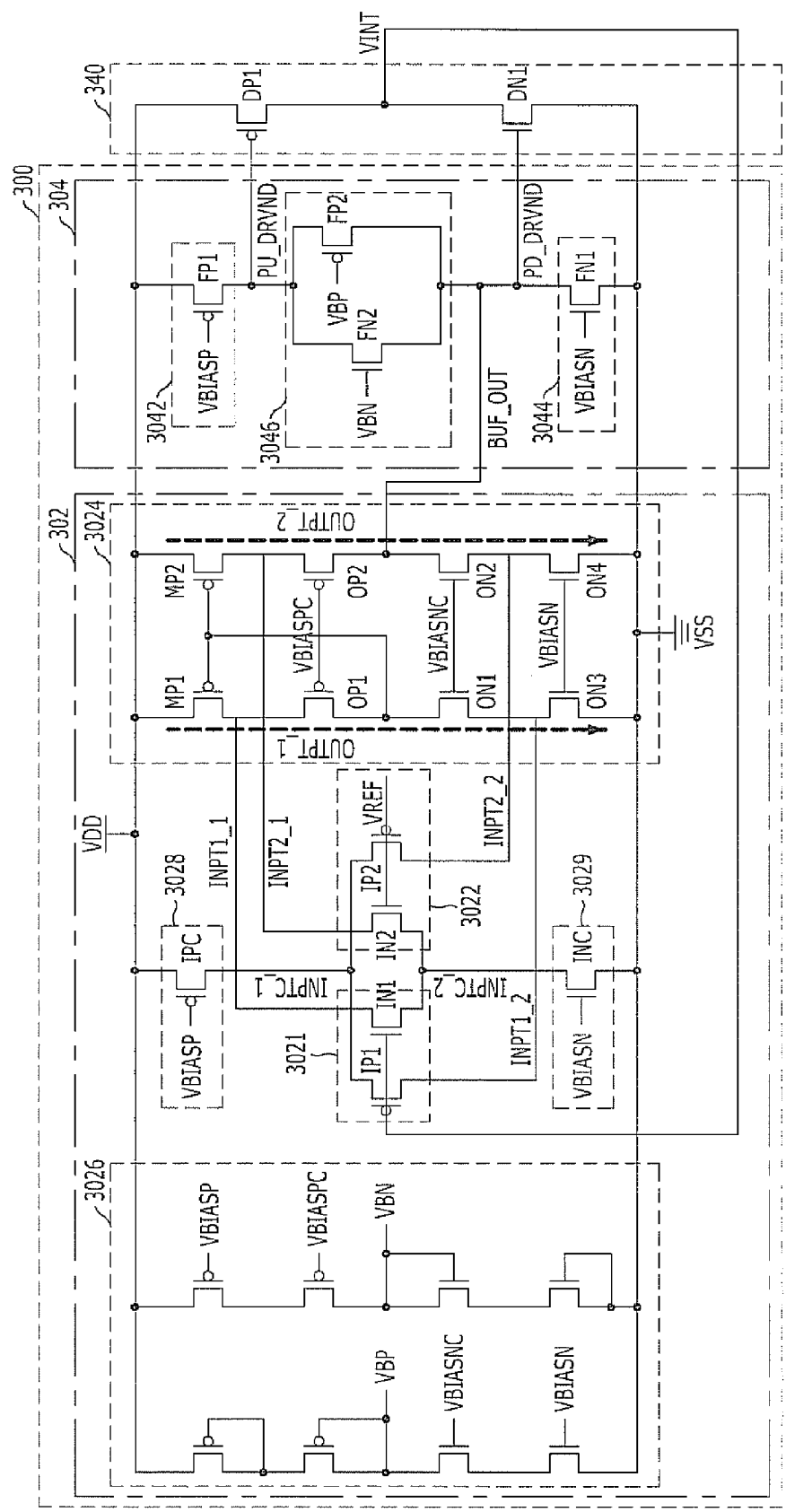

FIGS. 3A and 3B are circuit diagrams illustrating an internal voltage generation circuit of a semiconductor device in accordance with a first embodiment of the present invention.

Figure 4:
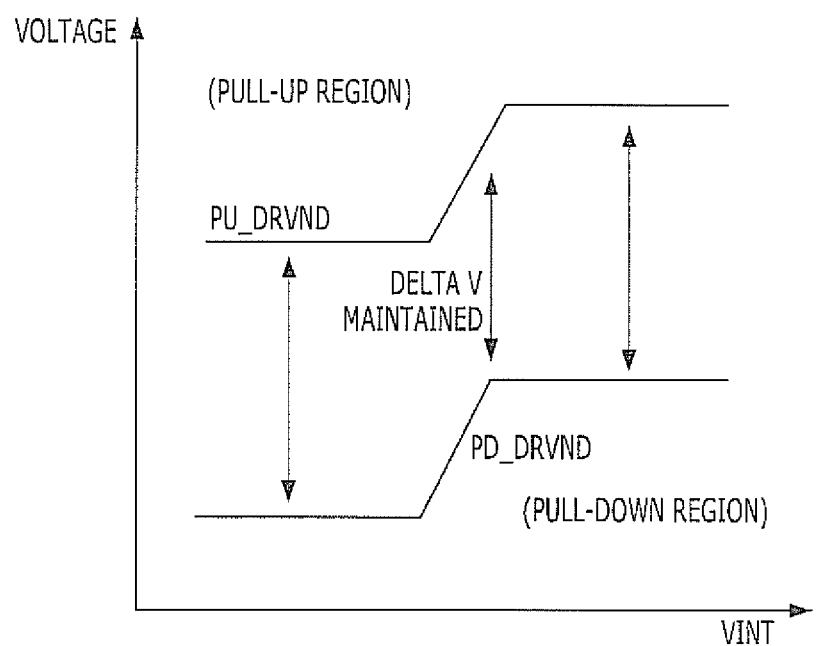
FIG. 4 is a graph illustrating operations of the internal voltage generation circuit of a semiconductor device in accordance with the first embodiment of the present invention shown in FIGS. 3A and 3B.

FIG. 4 is a graph illustrating operations of the internal voltage generation circuit of a semiconductor device in accordance with the first embodiment of the present invention shown in FIGS. 3A and 3B.

Referring to FIG. 3A, an internal voltage generation circuit of a semiconductor device in accordance with a first embodiment of the present invention includes an internal voltage input buffer 300, an internal voltage driving block 340, a current sourcing block 360, and a current sinking block 370. The internal voltage input buffer 300 includes a voltage detection unit 302 and a driving node level determination unit 304. The driving node level determination unit 304 includes a sourcing current source 3042, a sinking current source 3044, and a floating current source 3046.

The internal voltage input buffer 300 is configured, to determine voltage levels of a pull-up driving node PU_DRVND and a pull-down driving node PD_DRVND as a result of a comparison between a voltage level of an internal voltage (VINT) node and a voltage level of a reference voltage (VREF) node such that the pull-up driving node PU_DRVND and the pull-down driving node PD_DRVND maintain a voltage level difference DELTA V as shown in FIG. 4.

Among the component elements of the internal voltage input buffer 300, the voltage detection unit 302 is configured to compare the voltage level of the internal voltage (VINT) node and the voltage level of the reference voltage (VREF) node.

For example, the voltage detection unit 302 is configured to raise the voltage level of an output signal BUF_OUT when the voltage level of the internal voltage (VINT) node is higher than the voltage level of the reference voltage (VREF) node and lower the voltage level of the output signal BUF_OUT when the voltage level of the internal voltage (VINT) node is lower than the voltage level of the reference voltage (VREF) node.

Among the component elements of the internal voltage input buffer 300, the driving node level determination unit 304 is configured to determine the voltage levels of the pull-up driving node PU_DRVND and the pull-down driving node PD_DRVND in response to the output signal BUF_OUT of the voltage detection unit 302 so that the voltage level difference DELTA V is maintained.

Also, among the component elements of the driving node level determination unit 304, the sourcing current source 3042 is configured to apply a source current of a first magnitude to the pull-up driving node PU_DRVND. More specifically, the sourcing current source 3042 includes a PMOS transistor FP1. The PMOS transistor FP1 has a source terminal that is connected to a power supply voltage (VDD) terminal, a drain terminal that is connected to the pull-up driving node PU_DRVND, and a bias voltage VBIASP is inputted to the gate terminal. In addition, the PMOS transistor FP1 may operate in a saturated state. Due to this fact, the sourcing current source 3042 applies a source current of the first magnitude from the power supply voltage (VDD) terminal to the pull-up driving node PU_DRVND.

Similarly, among the component elements of the driving node level determination unit 304, the sinking current source 3044 is configured to allow current of a second magnitude to flow from the pull-down driving node PD_DRVND. More specifically, the sinking current source 3044 includes an NMOS transistor FN1. The NMOS transistor FN1 has a drain terminal that is connected to the pull-down driving node PD_DRVND, a source terminal to that a ground voltage (VSS) terminal is connected, and a bias voltage VBIASN is inputted to the gate terminal. In addition, the NMOS transistor FN1 may also operate in a saturated state. Due to this fact, the sinking current source 3044 allows current of the second magnitude to flow from the pull-down driving node PD_DRVND to the ground voltage (VSS) terminal.

Further, among the component elements of the driving node level determination unit 304, the floating current source 3046 is configured to allow current of a third magnitude to always flow between the pull-up driving node PU_DRVND and the pull-down driving node PD_DRVND when the output (BUF_OUT) node of the voltage detection unit 302 is connected between the floating current source 3046 and the pull-down driving node PD_DRVND and when the output (BUF_OUT) node changes the voltage level of the pull-down driving node PD_DRVND. Further, the floating current source 3046 is configured to change the voltage level of the pull-up driving node PU_DRVND by a voltage level variation amount of the pull-down driving node PD_DRVND corresponding to an amount of current supplied to the pull-down driving node PD_DRVND through the output (BUF_OUT) node of the voltage detection unit 302. The floating current source 3046 may have different configurations that also accomplish the above listed operations.

In summary, the floating current source 3046 in configured to allow the voltage level of the pull-up driving node PU_DRVND and the voltage level of the pull-down driving node PD_DRVND to always have the voltage level difference DELTA V. Further, the floating current source 3046 is configured to change the voltage level of the pull-down driving node PD_DRVND or the pull-up driving node PU_DRVND in response to a change of the voltage level of pull-up driving node PU_DRVND or the pull-down driving node PD_DRVND by the output signal BUF_OUT of the voltage detection unit 302.

In detail, the floating current source 3046 includes an NMOS transistor FN2 including a drain terminal that is connected to the pull-up driving node PU_DRVND, a source terminal that is connected to the pull-down driving node PD_DRVND, and a first bias voltage VBN is supplied to a gate terminal. In addition, the NMOS transistor FN2 may also operate in a saturated state. The floating current source 3046 further includes a PMOS transistor FP2 including a source terminal that is connected to the pull-up driving node PU_DRVND, a drain terminal that is connected to the pull-down driving node PD_DRVND, and a second bias voltage VBP is supplied to a gate terminal. In addition, the PMOS transistor FP2 may also operate in a saturated state.

Describing the operating principle of the floating current source 3046 in detail, since both the NMOS transistor FN2 and the PMOS transistor FP2 included in the floating current source 3046 operate in the saturated states and both the PMOS transistor FP1 and the NMOS transistor FN1 operate in the saturated states, an amount of source current applied to the floating current source 3046 and an amount of current flowing away from the floating current source 3046 to the ground voltage (VSS) terminal are the same.

In this state, where the voltage level of the pull-up driving node PU_DRVND rises or the voltage level of the pull-down driving node PD_DRVND rises according to the output signal BUF_OUT of the voltage detection unit 302, the gate-source voltage (Vgs) level of the NMOS transistor FN2 decreases due to the rise in the voltage level of the pull-up driving node PU_DRVND or the pull-down driving node PD_DRVND, and an amount of current flowing through the NMOS transistor FN2 is reduced.

At this time, since the amount of source current applied to the floating current source 3046 and the amount of current that flows from the floating current source 3046 to the ground voltage (VSS) terminal always become the same with each other as described above, an amount of current that does not flow through the NMOS transistor FN2 flows through the PMOS transistor FP2, and accordingly, the voltage level of the pull-down driving node PD_DRVND or the pull-up driving node PU_DRVND rises by the voltage level increase of the pull-up driving node PU_DRVND or the pull-down driving node PD_DRVND.

Conversely, where the voltage level of the pull-up driving node PU_DRVND falls or the voltage level of the pull-down driving node PD_DRVND falls according to the output signal BUFOUT of the voltage detection unit 302, the gate-source voltage (Vgs) level of the NMOS transistor FN2 increases due to the fall in the voltage level of the pull-up driving node PU_DRVND or the pull-down driving node PD_DRVND, and an amount of current flowing through the NMOS transistor FN2 is augmented.

At this time, since the amount of source current applied to the floating current source 3046 and the amount of current flowing from the floating current source 3046 always become the same with each other as described above, an amount of current flowing through the PMOS transistor FP2 decreases by an increase in an amount of current flowing through the NMOS transistor FN2, and accordingly, the voltage level of the pull-down driving node PD_DRVND or the pull-up driving node PU_DRVND falls by the decrease in the voltage level of the pull-up driving node PU_DRVND or the pull-down driving node PD_DRVND.

Due to the operations of the floating current source 3046 as described above, the driving node level determination unit 304 may allow the voltage levels of the pull-up driving node PU_DRVND and the pull-down driving node PD_DRVND to be changed with the voltage level difference DELTA V maintained as shown in FIG. 4.

The internal voltage driving block 340 is configured to pull-up drive the internal voltage (VINT) node in response to the voltage level of the pull-up driving node PU_DRVND and pull-down drive the internal voltage (VINT) node in response to the voltage level of the pull-down driving node PD_DRVND.

In detail, the internal voltage driving block 340 includes a PMOS transistor DP1 including a source terminal that is connected to the power supply voltage (VDD) terminal, a drain terminal that is connected to the internal voltage (VINT) node, and the pull-up driving node PU_DRVND is connected to a gate terminal to pull-up drive the internal voltage (VINT) node to the power supply voltage VDD in response to the voltage level of the pull-up driving node PU_DRVND. The internal voltage driving block 340 further includes an NMOS transistor DN1 including a drain terminal that is connected to the internal voltage (VINT) node, a source terminal that is connected to the ground voltage (VSS) terminal, and the pull-down driving node PD_DRVND is connected to a gate terminal to pull-down drive the internal voltage (VINT) node to the ground voltage VSS in response to the voltage level of the pull-down driving node PU_DRVND.

Since the voltage levels of the pull-up driving node PU_DRVND and the pull-down driving node PD_DRVND have the voltage level difference DELTA V, when the PMOS transistor DP1 included in the internal voltage driving block 340 is turned on or off, the NMOS transistor DN1 is turned off or on unconditionally.

In this way, since the voltage levels of the pull-up driving node PU_DRVND and the pull-down driving node PD_DRVND always have the voltage level difference DELTA V, an operation can be performed in such a manner that a dead zone does not exist. Thus, when the voltage level of the internal voltage (VINT) node is placed at a middle portion of the voltage level of the power supply voltage VDD during the operation of the internal voltage input buffer 300, the voltage level of the pull-up driving node PU_DRVND and the voltage level of the pull-down driving node PD_DRVND may slightly turn on both the PMOS transistor DP1 and the NMOS transistor DN1, by which through current may be produced slightly. However, even when both the PMOS transistor DP1 and the NMOS transistor DN1 are slightly turned on, because the pull-up driving node PU_DRVND and the pull-down driving node PD_DRVND maintain the voltage level difference DELTA V and the situation when the voltage level of the internal voltage (VINT) node is placed at the middle portion of the voltage level of the power supply voltage VDD is a very unstable situation and the period thereof is short, the magnitude of the through current produced in the internal voltage driving block 340 becomes a negligibly small amount.

In summary, in the internal voltage generation circuit in accordance with the first embodiment of the present invention, a situation in which both the PMOS transistor DP1 and the NMOS transistor DN1 of the internal voltage driving block 340 are fully turned on and through current of a large amount flows may be prevented, and the occurrence of a dead zone phenomenon in which both the PMOS transistor DP1 and the NMOS transistor DN1 are turned off may also be prevented.

In addition, in the internal voltage generation circuit in accordance with the first embodiment of the present invention, because the voltage levels of the pull-up driving node PU_DRVND and the pull-down driving node PD_DRVND are changed while including the voltage level difference DELTA V as shown in FIG. 4, the change range becomes relatively small.

In other words, since the highest voltage level of the pull-up driving node PU_DRVND is the voltage level of the power supply voltage VDD and the lowest voltage level of the pull-down driving node PD_DRVND is the voltage level of the ground voltage VSS, the lowest voltage level of the pull-up driving node PU_DRVND is not the ground voltage VSS, but a voltage level that is raised from the ground voltage VSS by the voltage level difference DELTA V with respect to the pull-down driving node PD_DRVND, and the highest voltage level of the pull-down driving node PD_DRVND is not the power supply voltage VDD, but a voltage level that is lowered from the power supply voltage VDD by the voltage level difference DELTA V with respect to the pull-up driving node PU_DRVND.

If the change range of the voltage levels of the pull-up driving node PU_DRVND and the pull-down driving node PD_DRVND is reduced in this way, a current driving force for pull-up driving or pull-down driving the internal voltage (VINT) node through the internal voltage driving block 340 decreases. As a result, the voltage level of the internal voltage (VINT) node may abruptly fall in a period in which the amount of an internal voltage VINT in use abruptly increases.

To address the above described issues, the sizes of the PMOS transistor DP1 and the NMOS transistor DN1, which are included in the internal voltage driving block 340, may be increased.

Nevertheless, if the sizes of the PMOS transistor DP1 and the NMOS transistor DN1 are increased, parasitic capacitance components increase when viewed from the sides of the pull-up driving node PU_DRVND and the pull-down driving node PD_DRVND, and the reaction speed of the internal voltage generation circuit itself may be slowed down.

Thus, in the internal voltage generation circuit in accordance with the first embodiment of the present invention, in order to maximally suppress an increase in the sizes of the PMOS transistor DP1 and the NMOS transistor DN1 and increase a current driving force, the current sourcing block 360 and the current sinking block 370, which are connected to the internal voltage driving block 340 in a current mirror type, are additionally included.

In detail, the current sourcing block 360 is connected to the pull-up driving node PU_DRVND in a current mirror type with respect to the internal voltage driving block 340, and the current sourcing block 360 is configured to apply a source current to the internal voltage (VINT) node. An amount of source current provided by the current sourcing block 360 is N times (N is an integer greater than 1) larger than an amount of source current provided to the internal voltage (VINT) node by the internal voltage driving block 340.

Further, the current sinking block 370 is connected to the pull-down driving node PD_DRVND in a current mirror type with respect to the internal voltage driving block 340, and the current sinking block 370 is configured to allow current to flow from the internal voltage (VINT) node. An amount of current that flows from the internal voltage (VINT) node by the current sinking block 370 is N times larger than an amount of current that flows from the internal voltage (VINT) node by the internal voltage driving block 340.

As the operation of the internal voltage driving block 340 is supplemented through the current sourcing block 360 and the current sinking block 370 as described above, the current driving forces of the current sourcing block 360 and the current sinking block 370 may be controlled according to the magnification 1:N of the current mirroring stages. As a consequence, an amount of current for driving the internal voltage (VINT) node may be increased, and the parasitic capacitance components viewed from the sides of the pull-up driving node PU_DRVND and the pull-down driving node PD_DRVND may be suppressed.

Referring to FIG. 3B, the detailed circuit of the internal voltage input buffer 300 among the component elements of the internal voltage generation circuit in accordance with the first embodiment of the present invention is shown. In particular, FIG. 3B shows the detailed circuit configuration of the voltage detection unit 302 among the component elements of the internal voltage input buffer 300.

In detail, the voltage detection unit 302 includes a first input section 3021, a second input section 3022, a detected voltage output section 3024, a bias voltage generating section 3026, a sourcing current source 3028, and a sinking current source 3029.

The bias voltage generating section 3026 is configured to generate bias voltages VBIASP, VBIASPC, VBP, VBIASN, VBIASNC and VBN that allow a plurality of PMOS transistors FP1, FP2, OP1, OP2 and IPC and a plurality of NMOS transistors FN1, FN2, ON1, ON2, ON3, ON4 and INC to operate in saturated states. The plurality of PMOS transistors FP1, FP2, OP1, OP2 and IPC and the plurality of NMOS transistors FN1, FN2, ON1, ON2, ON3, ON4 and INC may serve as current sources of the internal voltage input buffer 300.

The sourcing current source 3028 is configured to provide a source current to the first input section 3021 and the second input section 3022, and the sinking current source 3029 is configured to allow current to flow from the first input section 3021 and the second input section 3022.

The first input section 3021 is configured to control amounts of current that flows through first input current paths INPT1_1, INPT1_2, and INPTC_1 in response to the voltage level of the internal voltage (VINT) node.

More specifically, the first input section 3021 controls the amounts of current that flows through the first input current paths INPT1_1, INPT1_2, and INPTC_1 in a rail-to-rail type in response to the voltage level variations of the internal voltage (VINT) node.

Here, the rail-to-rail type indicates a circuit type used for stably receiving and detecting the voltage level of the internal voltage (VINT) node even when the voltage level variation range of the internal voltage (VINT) node is large.

In detail, the first input section 3021 includes a PMOS transistor IP1 that receives the voltage level of the internal voltage (VINT) node and controls the amounts of current flowing through the first input current paths INPT1_1, INPT1_2, and INPTC_1 when the voltage level of the internal voltage (VINT) node is relatively low, and an NMOS transistor IN1 that receives the voltage level of the internal voltage (VINT) node and controls the amounts of current flowing through the first input current paths INPT1_1, INPT1_2, and INPTC_1 when the voltage level of the internal voltage (VINT) node is relatively high. Therefore, the first input section 3021 may detect the voltage level of the internal voltage (VINT) node and control the amounts of current flowing through the first input current paths INPT1_1, INPT1_2, and INPTC_1 regardless of whether the voltage level of the internal voltage (VINT) node is high or low.

The second input section 3022 is configured to control amounts of current which flows through second input current paths INPT2_1, INPT2_2, and INPTC_2 in response to the voltage level of the reference voltage (VREF) node.

The second input section 3022 controls the amounts of current that flows through the second input current paths INPT2_1, INPT2_2, and INPTC_2 in a rail-to-rail type in response to the voltage level variations of the reference voltage (VREF) node.

More specifically, the second input section 3022 controls the amounts of current that flows through the second input current paths INPT2_1, INPT2_2, and INPTC_2 in a rail-to-rail type in response to the voltage level variations of the reference voltage (VREF) node.

Here, the rail-to-rail type indicates a circuit type used for stably receiving and detecting the voltage level of the reference voltage (VREF) node even when the voltage level variation range of the reference voltage (VREF) node is large.

In detail, the second input section 3022 includes a PMOS transistor IP2 that receives the voltage level of the reference voltage (VREF) node and controls the amounts of current flowing through the second input current paths INPT2_1, INPT2_2, and INPTC_2 when the voltage level of the reference voltage (VREF) node is relatively low, and an NMOS transistor IN2 that receives the voltage level of the reference voltage (VREF) node and controls the amounts of current flowing through the second input current paths INPT2_1, INPT2_2, and INPTC_2 when the voltage level of the reference voltage (VREF) node is relatively high. Therefore, the second input section 3022 may detect the voltage level of the reference voltage (VREF) node and control the amounts of current flowing through the second input current paths INPT2_1, INPT2_2, and INPTC_2 regardless of whether the voltage level of the reference voltage (VREF) node is high or low.

Of course, since the voltage level of the reference voltage (VREF) node that is detected by the second input section 3022 does not vary, the configuration that detects the voltage level of the reference voltage (VREF) node in the rail-to-rail type may not have any substantial meaning. Nonetheless, because the voltage level of the internal voltage (VINT) node that is detected by the first input section 3021 may have a large variation range, in order for stable operation of the voltage detection unit 302, the second input section 3022 includes the rail-to-rail type to correspond to the rail-to-rail type of the first input section 3021.

Hence, while the amounts of current flowing through the first input current paths INPT1_1, INPT1_2, and INPTC_1 in the first input section 3021 according to the voltage level of the internal voltage (VINT) node may be changed to a large extent, the amounts of current flowing through the second input current paths INPT2_1, INPT2_2, and INPTC_2 in the second input section 3022 according to the voltage level of the reference voltage (VREF) node are not changed.

The detected voltage output section 3024 is configured to control the voltage level of the detected voltage BUF_OUT in response to a difference between the magnitude of the current flowing through the first input current paths INPT1_1, INPT1_2, and INPTC_1 and the magnitude of the current flowing through the second input current paths INPT2_1, INPT2_2, and INPTC_2.

The detected voltage output section 3024 includes a first output current path OUTPT_1 that is connected to a current source in parallel to the first input current paths INPT1_1, INPT1_2, and INPTC_1 and is controlled in the amount of current thereof according to the magnitudes of the current flowing through the first input current paths INPT1_1, INPT1_2, and INPTC_1. The detected voltage output section 3024 further includes a second output current path OUTPT_2 that is connected to the first output current path OUTPT_1 in a current mirror type and is connected to a current source in parallel to the second input current paths INPT2_1, INPT2_2, and INPTC_2 and connected to a detected voltage (BUF_OUT) output terminal such that the magnitudes of current flowing through the second input current paths INPT2_1, INPT2_2, and INPTC_2 and the detected voltage (BUF_OUT) output terminal are controlled according to the magnitude of current flowing through the first output current path OUTPT_1.

In detail, among the component elements of the detected voltage output section 3024, the first output current path OUTPT_1 is connected to the current source in parallel to the first input current paths INPT1_1, INPT1_2, and INPTC_1. Accordingly, the magnitude of the current flowing through the first output current path OUTPT_1 is changed according to the magnitudes of the current flowing through the first input current paths INPT1_1, INPT1_2, and INPTC_1. For example, if the magnitudes of the current flowing through the first input current paths INPT1_1, INPT1_2, and INPTC_1 are increased, the magnitude of the current flowing through the first output current path OUTPT_1 is decreased. Similarly, if the magnitudes of the current flowing through the first input current paths INPT1_1, INPT1_2, and INPTC_1 are decreased, the magnitude of the current flowing through the first output current path OUTPT_1 is increased.

Further, among the component elements of the deteCted voltage output section 3024, the second output current path OUTPT_2 is connected to the first output current path OUTPT_1 in a current mirroring pattern. Therefore, the first output current path OUTPT_1 and the second output current path OUTPT_2 should have the same current magnitude change pattern.

Moreover, the second output current path OUTPT_2 is connected in parallel to the second input current paths INPT2_1, INPT2_2, and INPTC_2 and the detected voltage (BUF_OUT) output terminal. When considering that the amounts of the current flowing through the second input current paths INPT2_1, INPT2_2, and INPTC_2 are not changed since the voltage level of the reference voltage (VREF) node is not changed, a change in the amounts of current flowing through the second input current paths INPT2_1, INPT2_2, and INPTC_2 leads to a change in the amount of the current flowing through the detected voltage (BUF_OUT) output terminal.

For example, where the voltage level of the internal voltage (VINT) node rises higher than the voltage level of the reference voltage (VREF) node and the magnitudes of the current flowing through the first input current paths INPT1_1, INPT1_2, and INPTC_1 increase, and accordingly, the amounts of the current flowing through the first output current path OUTPT_1 and the second output current path OUTPT_2 increase, the amount of current flowing through the detected voltage (BUF_OUT) output terminal also increases to raise the voltage level of the pull-down driving node PD_DRVND or the pull-up driving node PU_DRVND. If the voltage level of the pull-down driving node PD_DRVND or the pull-up driving node PU_DRVND is raised in this way, the internal voltage driving block 340 pull-down drives the internal voltage (VINT) node to lower the voltage level of the internal voltage (VINT) node. The simultaneous raise in the voltage levels of the pull-down driving node PD_DRVND and the pull-up driving node PU_DRVND result from the operations of the driving node level determination unit 304. Since the detailed operations of the driving node level determination unit 304 were described above, further description thereof will be omitted.

Conversely, where the voltage level of the internal voltage (VINT) node falls lower than the voltage level of the reference voltage (VREF) node and the magnitudes of the current flowing through the first input current paths INPT1_1, INPT12, and INPTC_1 decrease, and accordingly, the amounts of the current flowing through the first output current path OUTPT_1 and the second output current path OUTPT_2 decrease, the amount of current flowing through the detected voltage (BUF_OUT) output terminal also decreases to lower the voltage level of the pull-down driving node PD_DRVND or the pull-up driving node PU_DRVND. If the voltage level of the pull-down driving node PD_DRVND or the pull-up driving node PU_DRVND is Lowered in this way, the internal voltage driving block 340 pull-up drives the internal voltage (VINT) node to raise the voltage level of the internal voltage (VINT) node. The simultaneous lowering in the voltage levels of the pull-down driving node PD_DRVND and the pull-up driving node PU_DRVND result from the operations of the driving node level determination unit 304. Since the detailed operations of the driving node level determination unit 304 were described above, further description thereof will be omitted.

For reference, the first output current path OUTPT_1 and the second output current path OUTPT_2 were described as connected to the detected voltage output section 3024 in current mirror types as shown in FIG. 3B, this configuration represents one exemplary embodiment. When the magnitudes of the current flowing through the first output current path OUTPT_1 and the second output current path OUTPT_2 are the same with each other, the aforementioned operations may be realized by using only one output current path. In spite of this fact, for stable operations of the voltage detection unit 302, a configuration such that the first output current path OUTPT_1 and the second output current path OUTPT_2 are connected to the detected voltage output section 3024 in current mirror types as shown in FIG. 3B may be advantageous.

<Second Embodiment>

Figure 5A:
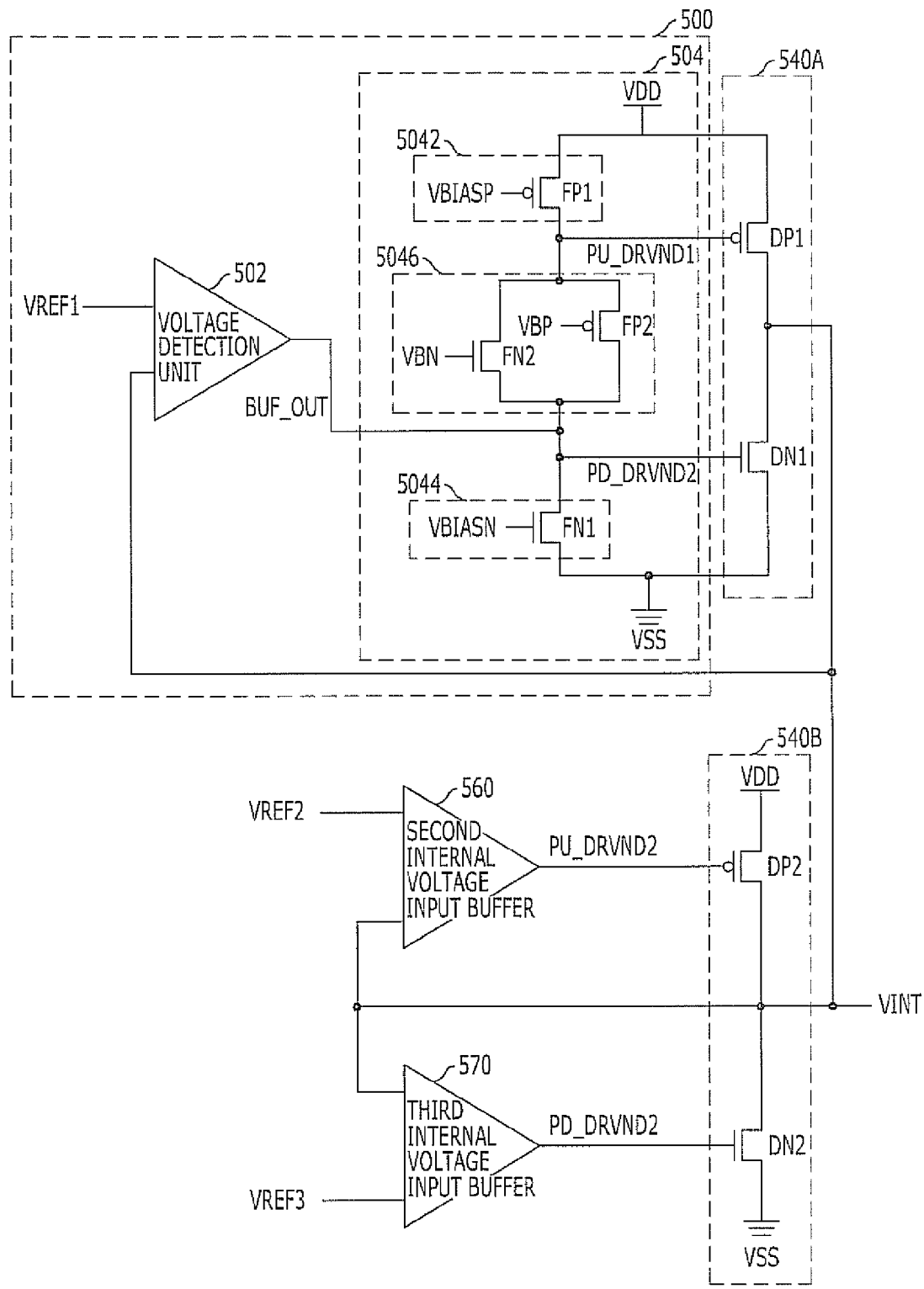
FIGS. 5A and 5B are circuit diagrams illustrating an internal voltage generation circuit of a semiconductor device in accordance with a second embodiment of the present invention.
Figure 5B:
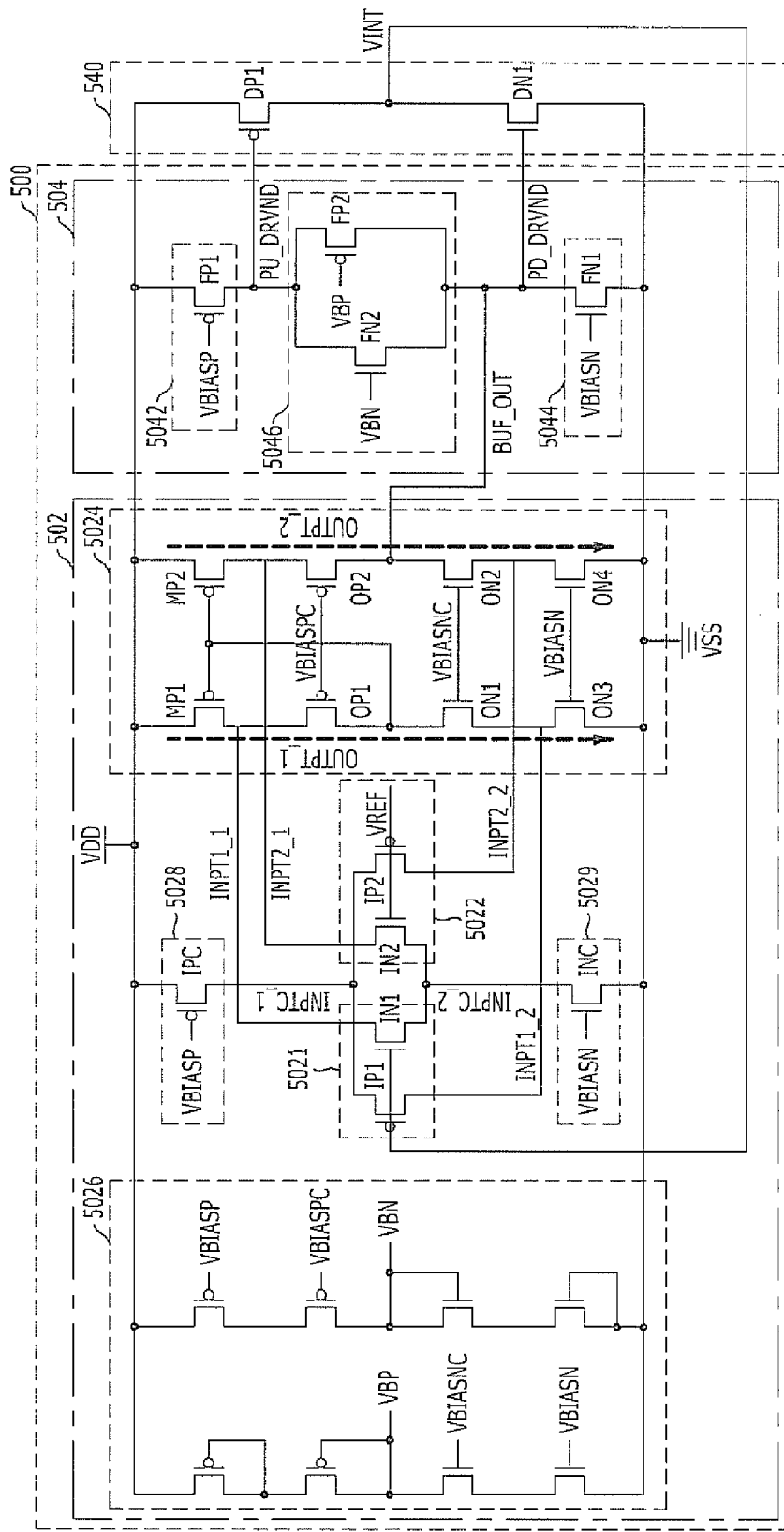

FIGS. 5A and 5B are circuit diagrams illustrating an internal voltage generation circuit of a semiconductor device in accordance with a second embodiment of the present invention.

Figure 6:
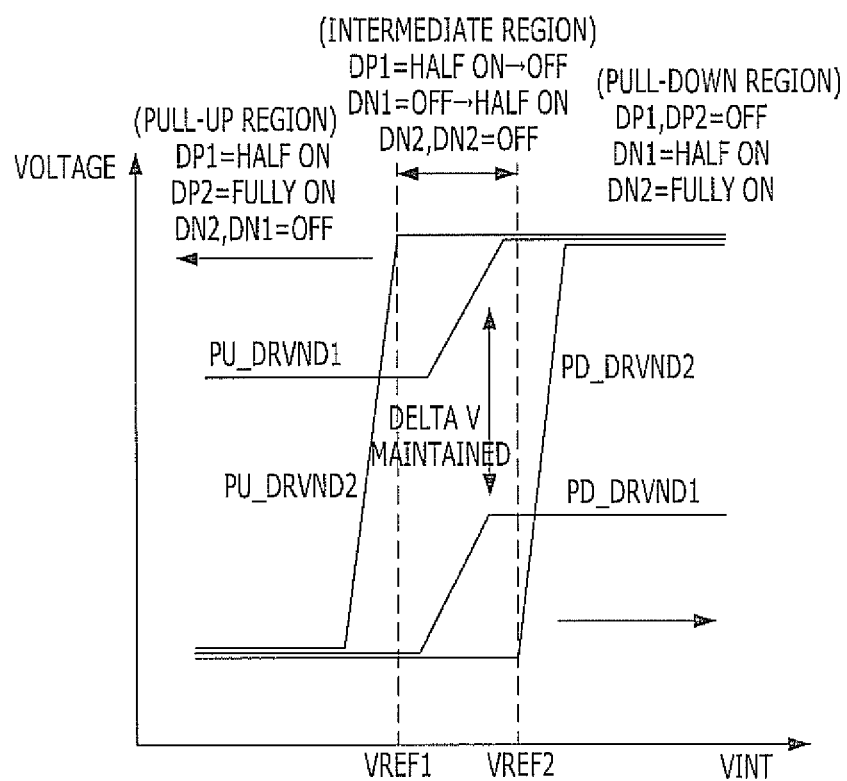
FIG. 6 is a graph illustrating operations of the internal voltage generation circuit of a semiconductor device in accordance with the second embodiment of the present invention shown in FIGS. 5A and 5B.

FIG. 6 is a graph illustrating operations of the internal voltage generation circuit of a semiconductor device in accordance with the second embodiment of the present invention shown in FIGS. 5A and 5B.

Referring to FIG. 5A, an internal voltage generation circuit of a semiconductor device in accordance with a second embodiment of the present invention includes a first internal voltage input buffer 500, a second internal voltage input buffer 560, a third internal voltage input buffer 570, and internal voltage driving blocks 540A and 5408. The first internal voltage input buffer 500 includes a voltage detection unit 502 and a driving node level determination unit 504. The driving node level determination unit 504 is configured to include a sourcing current source 5042, a sinking current source 5044, and a floating current source 5046.

The first internal voltage input buffer 500 is configured to determine the voltage levels of a first pull-up driving node PU_DRVND1 and a first pull-down driving node PD_DRVND1 as a result of a comparison between a voltage level of an internal voltage (VINT) node and a voltage level of a first reference voltage (VREF1) node such that the first pull-up driving node PU_DRVND1 and the first pull-down driving node PD_DRVND1 maintain a voltage level difference DELTA V.

Among the component elements of the first internal voltage input buffer 500, the voltage detection unit 502 is configured to compare the voltage level of the internal voltage (VINT) node and the first reference voltage (VREF1) node.

For example, the voltage detection unit 502 is configured to raise the voltage level of an output signal BUF_OUT when the voltage level of the internal voltage (VINT) node is higher than the voltage level of the first reference voltage (VREF1) node and lower the voltage level of the output signal BUF_OUT when the voltage level of the internal voltage (VINT) node is lower than the voltage level of the first reference voltage (VREF1) node.

Among the component elements of the first internal voltage input buffer 500, the driving node level determination unit 504 is configured to determine the voltage levels of the first pull-up driving node PU_DRVND1 and the first pull-down driving node PD_DRVND1 in response to the output signal BUF_OUT of the voltage detection unit 502 so that the voltage level difference DELTA V is maintained.

Also, among the component elements of the driving node level determination unit 504, the sourcing current source 5042 is configured to apply a source current of a first magnitude to the first pull-up driving node PU_DRVND1. More specifically, the sourcing current source 5042 includes a PMOS transistor FP1. The PMOS transistor FP1 has a source terminal that is connected to a power supply voltage (VDD) terminal, a drain terminal that is connected to the first pull-up driving node PU_DRVND1, and a bias voltage VBIASP is inputted to the gate terminal In addition, the PMOS transistor FP1 may operate in a saturated state. Due to this fact, the sourcing current source 5042 applies a source current of the first magnitude from the power supply voltage (VDD) terminal to the first pull-up driving node PU_DRVND1.

Similarly, among the component elements of the driving node level determination unit 504, the sinking current source 5044 is configured to allow current of a second magnitude to flow from the first pull-down driving node PD_DRVND1. More specifically, the sinking current source 5044 includes an NMOS transistor FN1. The NMOS transistor FN1 has a drain terminal that is connected to the first pull-down driving node PD_DRVND1, a source terminal to that a ground voltage (VSS) terminal is connected, and a bias voltage VBIASN is inputted to the gate terminal. In addition, the NMOS transistor FN1 may also operate in a saturated state. Due to this fact, the sinking current source 5044 allows current of the second magnitude to flow from the first pull-down driving node PD_DRVND1 to the ground voltage (VSS) terminal.

Further, among the component elements of the driving node level determination unit 504, the floating current source 5046 is configured to allow current of a third magnitude to always flow between the first pull-up driving node PU_DRVND1 and the first pull-down driving node PD_DRVND1 when the output (BUF_OUT) node of the voltage detection unit 502 is connected between the floating current source 5046 and the first pull-down driving node PD_DRVND1 and when the output (BUF_OUT) node changes the voltage level of the first pull-down driving node PD_DRVND1. Further, the floating current source 5046 is configured to change the voltage level of the first pull-up driving node PU_DRVND1 by a voltage level variation amount of the first pull-down driving node PD_DRVND1 corresponding to an amount of current supplied to the first pull-down driving node PD_DRVND1 through the output (BUF_OUT) node of the voltage detection unit 502. The floating current source 5046 may have different configurations that also accomplish the above listed operations.

In summary, among the component elements of the driving node level determination unit 504, the floating current source 5046 is configured to allow the voltage level of the first pull-up driving node PU_DRVND1 and the voltage level of the first pull-down driving node PD_DRVND1 to always have the voltage level difference DELTA V. Further, the floating current source 3046 is configured to change the voltage level of the first pull-down driving node PD_DRVND1 or the first pull-up driving node PU_DRVND1 in response to a change of the voltage level of first pull-up driving node PU_DRVND1 or the first pull-down driving node PD_DRVND1 by the output signal BUF_OUT of the voltage detection unit 502.

In detail, the floating current source 5046 includes an NMOS transistor FN2 including a drain terminal that is connected to the first pull-up driving node PU_DRVND1, a source terminal that is connected to the first pull-down driving node PD_DRVND1, and a first bias voltage VBN is supplied to a gate terminal. In addition, the NMOS transistor FN2 may also operate a saturated state. The floating current source further includes a PMOS transistor FP2 including a source terminal that is connected to the first pull-up driving node PU_DRVND1, a drain terminal that is connected to the first pull-down driving node PD_DRVND1, and a second bias voltage VBP is supplied to a gate terminal. In addition, the PMOS transistor FP2 may also operate in a saturated state.

Describing the operating principle of the floating current source 5046 in detail, since both the NMOS transistor FN2 and the PMOS transistor FP2 included in the floating current source 5046 operate in the saturated states and both the PMOS transistor FP1 and the NMOS transistor FN1 operate in the saturated states, an amount of source current applied to the floating current source 5046 and an amount of current flowing away from the floating current source 5046 are the same.

In this state, where the voltage level of the first pull-up driving node PU_DRVND1 rises or the voltage level of the first pull-down driving node PD_DRVND1 rises according to the output signal BUF_OUT of the voltage detection unit 502, the gate-source voltage (Vgs) level of the NMOS transistor FN2 decreases due to the rise in the voltage level of the first pull-up driving node PU_DRVND1 or the first pull-down driving node PD_DRVND1, and an amount of current flowing through the NMOS transistor FN2 is reduced.

At this time, since the amount of source current applied to the floating current source 5046 and the amount of current that flows from the floating current source 5046 always become the same with each other as described above, an amount of current that does not flow through the NMOS transistor FN2 flows through the PMOS transistor FP2, and accordingly, the voltage level of the first pull-down driving node PD_DRVND1 or the first pull-up driving node PU_DRVND1 rises by the voltage level increase of the first pull-up driving node PU_DRVND1 or the first pull-down driving node PD_DRVND1.

Conversely, where the voltage level of the first pull-up driving node PU_DRVND1 falls or the voltage level of the first pull-down driving node PD_DRVND1 falls according to the output signal BUF_OUT of the voltage detection unit 502, the gate-source voltage (Vgs) level of the NMOS transistor FN2 increases due to the fall in the voltage level of the first pull-up driving node PU_DRVND1 or the first pull-down driving node PD_DRVND1, and an amount of current flowing through the NMOS transistor FN2 is augmented.

At this time, since the amount of source current applied to the floating current source 5046 and the amount of current flowing from the floating current source 5046 always become the same with each other as described above, an amount of current flowing through the PMOS transistor FP2 decreases by an increase in an amount of current flowing through the NMOS transistor FN2, and accordingly, the voltage level of the first pull-down driving node PD_DRVND1 or the first pull-up driving node PU_DRVND1 falls by the decrease in the voltage level of the first pull-up driving node PU_DRVND1 or the first pull-down driving node PD_DRVND1.

Due to the operations of the floating current source 5046 as described above, the driving node level determination unit 504 may allow the voltage levels of the first pull-up driving node PU_DRVND1 and the first pull-down driving node PD_DRVND1 to be changed with the voltage level difference DELTA V maintained as shown in FIG. 6.

The internal voltage driving blocks 540A and 540B are configured to pull-up drive the internal voltage (VINT) node in response to the respective voltage levels of the first pull-up driving node PU_DRVND1 and a second pull-up driving node PU_DRVND2 and pull-down drive the internal voltage (VINT) node in response to the respective voltage levels of the first pull-down driving node PD_DRVND1 and a second pull-down driving node PD_DRVND2.

In detail, the internal voltage driving blocks 540A and 540B include a first internal voltage driving block 540A that is configured to pull-up and pull-down drive the internal voltage (VINT) node in response to voltage level variations of the first pull-up driving node PU_DRVND1 and the first pull-down driving node PD_DRVND1, and a second internal voltage driving block 540B that is configured to pull-up and pull-down drive the internal voltage (VINT) node in response to voltage level variations of the second pull-up driving node PU_DRVND2 and the second pull-down driving node PD_DRVND2.

The first internal voltage driving block 540A includes a first PMOS transistor DP1 including a source terminal that is connected to the power supply voltage (VDD) terminal, a drain terminal that is connected to the internal voltage (VINT) node, and the first pull-up driving node PU_DRVND1 is connected to a gate terminal to pull-up drive the internal voltage (VINT) node to the power supply voltage VDD in response to the voltage level of the first pull-up driving node PU_DRVND1 The internal voltage driving block 340 further includes a first NMOS transistor DN1 including a drain terminal that is connected to the internal voltage (VINT) node, a source terminal that is connected to the ground voltage (VSS) terminal, and the first pull-down driving node PD_DRVND1 is connected to a gate terminal to pull-down drive the internal voltage (VINT) node to the ground voltage VSS in response to the voltage level of the first pull-dawn driving node PU_DRVND1.

Since the voltage levels of the first pull-up driving node PU_DRVND and the first pull-down driving node PD_DRVND have the voltage level difference DELTA V, when the first PMOS transistor DP1 included in the first internal voltage driving block 540A is turned on or off, the first NMOS transistor DN1 is turned off or on unconditionally.

In this way, since the voltage levels of the first pull-up driving node PU_DRVND1 and the first pull-down driving node PD_DRVND1 always have the voltage level difference DELTA V as shown in FIG. 6 due to the operations of the first internal voltage input buffer 500, an operation can be performed in such a manner that a dead zone does not exist. Thus, when the voltage level of the internal voltage (VINT) node is placed at a middle portion of the voltage level of the power supply voltage VDD during the operation of the first internal voltage input buffer 500, the voltage level of the first pull-up driving node PU_DRVND1 and the voltage level of the first pull-down driving node PD_DRVND1 may slightly turn on both the first PMOS transistor DP1 and the first NMOS transistor DN1, by which through current may be produced slightly. However, even when both the first PMOS transistor DP1 and the first NMOS transistor DN1 are slightly turned on, because the first pull-up driving node PU_DRVND1 and the first pull-down driving node PD_DRVND1 maintain the voltage level difference DELTA V as shown in FIG. 6 and the situation when the voltage level of the internal voltage (VINT) node is placed at the middle portion of the voltage level of the power supply voltage VDD, is a very unstable situation and the period thereof is short, the magnitude of the through current produced in the first internal voltage driving block 540A becomes a negligibly small amount.

In summary, in the internal voltage generation circuit in accordance with the second embodiment of the present invention, a situation in which both the first PMOS transistor DP1 and the first NMOS transistor DN1 of the first internal voltage driving block 540A are fully turned on and through current of a large amount flows may be prevented, and the occurrence of a dead zone phenomenon in which both the first PMOS transistor DP1 and the first NMOS transistor DN1 are turned off may also be prevented.

In addition, in the first internal voltage input buffer 500, because the voltage levels of the first pull-up driving node PU_DRVND1 and the first pull-down driving node PD_DRVND1 are changed while including the voltage level difference DELTA V as shown in FIG. 6, the change range becomes relatively small.

In other words, since the highest voltage level of the first pull-up driving node PU_DRVND1 is the voltage level of the power supply voltage VDD and the lowest voltage level of the first pull-down driving node PD_DRVND1 is the voltage level of the ground voltage VSS, the lowest voltage level of the first pull-up driving node PU_DRVND1 is not the ground voltage VSS, but a voltage level that is raised from of the ground voltage VSS by the voltage level difference DELTA V with respect to the first pull-down driving node PD_DRVND1, and the highest voltage level of the first pull-down driving node PD_DRVND1 is not the power supply voltage VDD, but a voltage level that is lowered from the power supply voltage VDD by the voltage level difference DELTA V with respect to the first pull-up driving node PU_DRVND1.

If the change range of the voltage levels of the first pull-up driving node PU_DRVND1 and the first pull-down driving node PD_DRVND1 is reduced in this way, a current driving force for pull-up driving or pull-down driving the internal voltage (VINT) node through the first internal voltage driving block 540A decreases. Therefore, the voltage level variations of the internal voltage (VINT) node, for example, only through the operations of the first internal voltage input buffer 500 and the first internal voltage driving block 540A may not be handled. For example, if only the first internal voltage input buffer 500 and the first internal voltage driving block 540A operate, the voltage level of the internal voltage (VINT) node may abruptly fall in a period in which the in-use amount of an internal voltage VINT abruptly increases.

Accordingly, in the internal voltage generation circuit of a semiconductor device in accordance with the second embodiment of the present invention, issues likely to be caused due to operations of the first internal voltage input buffer 500 and the first internal voltage driving block 540A are addressed through operations of the second internal voltage input buffer 560 and the third internal voltage input buffer 570 in addition to the first internal voltage input buffer 500.

In detail, the second internal voltage input buffer 560 is configured to determine the voltage level of the second pull-up driving node PU_DRVND2 by comparing the voltage level variations of the internal voltage (VINT) node to the voltage level of a second reference voltage (VREF2) node.

For example, the second internal voltage input buffer 560 is configured to raise the voltage level of the second pull-up driving node PU_DRVND2 when the voltage level of the internal voltage (VINT) node is higher than the voltage level of the second reference voltage (VREF2) node and lower the voltage level of the second pull-up driving node PU_DRVND2 when the voltage level of the internal voltage (VINT) node is lower than the voltage level of the second reference voltage (VREF2) node.

The third internal voltage input buffer 570 is configured to determine the voltage level of the second pull-down driving node PD_DRVND2 by comparing the voltage level variations of the internal voltage (VINT) node to the voltage level of a third reference voltage (VREF3) node.

For example, the third internal voltage input buffer 570 is configured to raise the voltage level of the second pull-down driving node PD_DRVND2 when the voltage level of the internal voltage (VINT) node is higher than the voltage level of the third reference voltage (VREF3) node and lower the voltage level of the second pull-down driving node PD_DRVND2 when the voltage level of the internal voltage (VINT) node is lower than the voltage level of the third reference voltage (VREF3) node.

At this time, as shown in FIG. 6, the voltage level of the second reference voltage (VREF2) node is to be lower than the voltage level of the third reference voltage (VREF3) node. Also, the voltage level of the first reference voltage (VREF1) node is to be higher than the voltage level of the second reference voltage (VREF2) node and lower than the voltage level of the third reference voltage (VREF3) node.

Among the component elements of the internal voltage driving blocks 540A and 540B, the second internal voltage driving block 540B includes a second PMOS transistor DP2 including a source terminal that is connected to the power supply voltage (VDD) terminal, a drain terminal that is connected to the internal voltage (VINT) node, and the second pull-up driving node PU_DRVND2 is connected to a gate terminal to pull-up drive the internal voltage (VINT) node to the power supply voltage VDD in response to the voltage level of the second pull-up driving node PU_DRVND2. The second internal voltage driving block 540B further includes a second NMOS transistor DN2 including a drain terminal that is connected to the internal voltage (VINT) node, a source terminal that is connected to the ground voltage (VSS) terminal, and the second pull-down driving node PD_DRVND2 is connected to a gate terminal to pull-down drive the internal voltage (VINT) node to the ground voltage VSS in response to the voltage level of the second pull-down driving node PU_DRVND2.

Referring to FIG. 6, operations of the second internal voltage input buffer 560 and the third internal voltage input buffer 570 are divided into three regions depending upon the voltage levels of the second pull-up driving node PU_DRVND2, the second pull-down driving node PD_DRVND2, and the internal voltage (VINT) node.

In detail, in a pull-up region corresponding when the voltage level of the internal voltage (VINT) node is lower than the voltage level of the second reference voltage (VREF2) node, the voltage levels of the second pull-up driving node PU_DRVND2 and the second pull-down driving node PD_DRVND2 become the same with the voltage level of the ground voltage VSS, and the second PMOS transistor DP2 for pull-up driving the internal voltage (VINT) node is turned on, and the second NMOS transistor DN2 for pull-down driving the internal voltage (VINT) node is turned off. Namely, current to be applied from the power supply voltage (VDD) terminal to the internal voltage (VINT) node is produced, and current to flow from the internal voltage (VINT) node to the ground voltage (VSS) terminal is not produced. Accordingly, the voltage level of the internal voltage (VINT) node rises.

In a pull-down region corresponding to when the voltage Level of the internal voltage (VINT) node is higher than the voltage level of the third reference voltage (VREF3) node, the voltage levels of the second pull-up driving node PU_DRVND2 and the second pull-down driving node PD_DRVND2 become the same with the voltage level of the power supply voltage VDD, and the second NMOS transistor DN2 for pull-down driving the internal voltage (VINT) node is turned on, and the second PMOS transistor DP2 for pull-up driving the internal voltage (VINT) node is turned off. Namely, current to flow from the internal voltage (VINT) node to the ground voltage (VSS) terminal is produced, and current to be applied from the power supply voltage (VDD) terminal to the internal voltage (VINT) node is not produced. Accordingly, the voltage level of the internal voltage (VINT) node falls.

Further, in an intermediate region corresponding to when the voltage level of the internal voltage (VINT) node is higher than the voltage level of the second reference voltage (VREF2) node and is lower than the voltage level of the third reference voltage (VREF3) node, the voltage level of the second pull-up driving node PU_DRVND2 becomes the same with the voltage level of the power supply voltage VDD, and the voltage level of the second pull-down driving node PD_DRVND2 becomes the same with the voltage level of the ground voltage VSS, and both the second PMOS transistor DP2 for pull-up driving the internal voltage (VINT) node and the second NMOS transistor DN2 for pull-down driving the internal voltage (VINT) node are turned off. Namely, current to flow from the internal voltage (VINT) node to the ground voltage (VSS) terminal is not produced, and current to be applied from the power supply voltage (VDD) terminal to the internal voltage (VINT) node is not produced. Accordingly, in the intermediate region, a driving force for changing the voltage level of the internal voltage (VINT) node is not present.

In this way, in the process in which the voltage level of, the internal voltage (VINT) node rises to a relatively great extent through the operations of the second internal voltage input buffer 560 and the third internal voltage input buffer 570, more specifically, in the process in which the voltage level of the internal voltage (VINT) node shifts from the intermediate region to the pull-up region when viewed from the voltage level of the second reference voltage (VRFF2) node, the voltage level of the second pull-up driving node PU_DRVND2 is changed from the voltage level of the power supply voltage VDD to the voltage level of the ground voltage VSS, by which the second internal voltage driving block 540B may have a great current driving force. Also, in the process in which the voltage level of the internal voltage (VINT) node falls to a relatively great extent, more specifically, in the process in which the voltage level of the internal voltage (VINT) node shifts from the intermediate region to the pull-down region when viewed from the voltage level of the third reference voltage (VREF3) node, the voltage level of the second pull-up driving node PU_DRVND2 is changed from the voltage level of the ground voltage VSS to the voltage level of the power supply voltage VDD, by which the second internal voltage driving blocks 540A and 540B may have a great current driving force.

In the intermediate region in which the second pull-up driving node PU_DRVND2 becomes the same state as the voltage level of the power supply voltage VDD, and the second pull-down driving node PD_DRVND2 becomes the same state as the voltage level of the ground voltage VSS, and the second internal voltage driving block 540B has not current driving force, since the first internal voltage input buffer 500 operates such that the voltage levels of the first pull-up driving node PU_DRVND1 and the second pull-up driving node PU_DRVND2 are changed with the voltage level difference DELTA V, the first internal voltage driving block 540A has a current driving force.

Thus, as in the aforementioned second embodiment of the present invention, since the operations of the internal voltage driving blocks 540A and 540B are controlled through the first to third internal voltage input buffers 500, 560 and 570, driving current of a sufficient magnitude may be provided in any voltage level variation period of the internal voltage (VINT) node.

Referring to FIG. 5B, the detailed circuit of the internal voltage input buffer 500 among the component elements of the internal voltage generation circuit in accordance with the second embodiment of the present invention is shown. In particular, FIG. 5B shows the detailed circuit configuration of the voltage detection unit 502 among the component elements of the internal voltage input buffer 500.

In detail, the voltage detection unit 502 includes a first input section 5021, a second input section 5022, a detected voltage output section 5024, a bias voltage generating section 5026, a sourcing current source 5028, and a sinking current source 5029.

The bias voltage generating section 5026 is configured to generate bias voltages VBIASP, VBIASPC, VBP, VBIASN, VBIASNC and VBN that allow a plurality of PMOS transistors FP1, FP2, OP1, OP2 and IPC and a plurality of NMOS transistors FN1, FN2, ON1, ON2, ON3, ON4 and INC to operate in saturated states. The plurality of PMOS transistors FP1, FP2, OP1, OP2 and IPC and the plurality of NMOS transistors FN1, FN2, ON1, ON2, ON3, ON4 and INC may serve as current sources of the internal voltage input buffer 300.

The sourcing current source 5028 is configured to provide a source current to the first input section 5021 and the second input section 5022, and the sinking current source is configured to allow current to flow from the first input section 5021 and the second input section 5022.

The first input section 5021 is configured to control amounts of current that flows through first input current paths INPT1_1, INPT1_2, and INPTC_1 in response to the voltage level of the internal voltage (VINT) node.

More specifically, the first input section 5021 controls the amounts of current that flows through the first input current paths INPT1_1, INPT1_2 and INPTC_1, in a rail-to-rail type in response to the voltage level variations of the internal voltage (VINT) node.

Here, the rail-to-rail type indicates a circuit type used for stably receiving and detecting the voltage level of the internal voltage (VINT) node even when the voltage level variation range of the internal voltage (VINT) node is large.

In detail, the first input section 5021 includes a PMOS transistor IP1 that receives the voltage level of the internal voltage (VINT) node and controls the amounts of current flowing through the first input current paths INPT1_1, INPT1_2, and INPTC_1 when the voltage level of the internal voltage (VINT) node is relatively low. The first input section 5021 further includes an NMOS transistor IN1 that receives the voltage level of the internal voltage (VINT) node and controls the amounts of current flowing through the first input current paths INPT1_1, INPT1_2, and INPTC_1 when the voltage level of the internal voltage (VINT) node is relatively high. Therefore, the first input section 5021 may detect the voltage level of the internal voltage (VINT) node and control the amounts of current flowing through the first input current paths INPT1_1, INPT1_2, and INPTC_1 regardless of whether the voltage level of the internal voltage (VINT) node is high or low.

The second input section 5022 is configured to control amounts of current which flows through second input current paths INPT2_1, INPT2_2, and INPTC_2, in response to the voltage level of the reference voltage (VREF) node.

The second input section 5022 controls the amounts of current that flows through the second input current paths INPT2_1, INPT2_2, and INPTC_2 in a rail-to-rail type in response to the voltage level variations of the first reference voltage (VREF1) node.

More specifically, the second input section 3022 controls the amounts of current that flows through the second input current paths INPT2_1, INPT2_2, and INPTC_2 in a rail-to-rail type in response to the voltage level variations of the reference voltage (VREF) node.

Here, the rail-to-rail type indicates a circuit type used for stably receiving and detecting the voltage level of the reference voltage (VREF) node even when the voltage level variation range of the first reference voltage (VREF1) node is large.

In detail, the second input section 5022 includes a PMOS transistor IP2 that receives the voltage level of the reference voltage (VREF) node and controls the amounts of current flowing through the second input current paths INPT2_1, INPT2_2, and INPTC_2 when the voltage level of the first reference voltage (VREF1) node is relatively low. The second input section 5022 further includes an NMOS transistor IN2 that receives the voltage level of the reference voltage (VREF) node and controls the amounts of current flowing through the second input current paths INPT2_1, INPT2_2, and INPTC_2 when the voltage level of the first reference voltage (VREF1) node is relatively high. Therefore, the second input section 5022 may detect the voltage level of the reference voltage (VREF) node and control the amounts of current flowing through the second input current paths INPT2_1, INPT2_2, and INPTC_2 regardless of whether the voltage level of the first reference voltage (VREF1) node is high or low.

Of course, since the voltage level of the first reference voltage (VREF1) node that is detected by the second input section 5022 does not vary, the configuration of detecting the voltage level of the first reference voltage (VREF1) node in the rail-to-rail type may not have any substantial meaning. Nonetheless, because the voltage level of the internal voltage (VINT) node that is detected by the first input section 5021 may have a large variation range, in order for stable operation of the voltage detection unit 502, the second input section 5022 includes the rail-to-rail type to correspond to the rail-to-rail type of the first input section 5021.

Hence, while the amounts of current flowing through the first input current paths INPT1_1, INPT1_2, and INPTC_1 in the first input section 5021 according to the voltage level of the internal voltage (VINT) node may be changed to a large extent, the amounts of current flowing through the second input current paths INPT2_1, INPT2_2, and INPTC_2 in the second input section 5022 according to the voltage level of the first reference voltage (VREF1) node are not changed.

The detected voltage output section 5024 is configured to control the voltage level of the detected voltage BUF_OUT in response to a difference between the magnitude of the current flowing through the first input current paths INPT1_1, INPT1_2, and INPTC_1 and the magnitude of the current flowing through the second input current paths INPT2_1, INPT2_2, and INPTC_2.

The detected voltage output section 5024 includes a first output current path OUTPT_1 that is connected to a current source in parallel to the first input current paths INPT1_1, INPT1_2, and INPTC_1 and is controlled in the amount of current thereof according to the magnitudes of the current flowing through the first input current paths INPT1_1, INPT1_2, and INPTC_1. The detected voltage output section further includes a second output current path OUTPT_2 that is connected to the first output current path OUTPT_1 in a current mirror type and is connected to a current source in parallel to the second input current paths INPT2_1, INPT2_2, and INPTC_2 and a detected voltage (BUF_OUT) output terminal such that the magnitudes of current flowing through the second input current paths INPT2_1, INPT2_2 and INPTC_2 and the detected voltage (BUF_OUT) output terminal are controlled according to the magnitude of current flowing through the first output current path OUTPT_1.

In detail, among the component elements of the detected voltage output section 5024, the first output current path OUTPT_1 is connected to the current source in parallel to the first input current paths INPT1_1, INPT1_2, and INPTC_1. Accordingly, the magnitude of the current flowing through the first output current path OUTPT_1 is changed according to the magnitudes of the current flowing through the first input current paths INPT1_1, INPT1_2, and INPTC_1. For example, if the magnitudes of the current flowing through the first input current paths INPT1_1, INPT1_2, and INPTC_1 are increased, the magnitude of the current flowing through the first output current path OUTPT_1 is decreased. Similarly, if the magnitudes of the current flowing through the first input current paths INPT1_1, INPT1_2, and INPTC_1 are decreased, the magnitude of the current flowing through the first output current path OUTPT_1 is increased.

Further, among the component elements of the detected voltage output section 5024, the second output current path OUTPT_2 is connected to the first output current path OUTPT_1 in a current mirroring pattern. Therefore, the first output current path OUTPT_1 and the second output current path OUTPT_2 should have the same current magnitude change pattern.

Moreover, the second output current path OUTPT_2 is connected in parallel to the second input current paths INPT2_1, INPT2_2, and INPTC_2 and the detected voltage (BUF_OUT) output terminal. When considering that the amounts of the current flowing through the second input current paths INPT2_1, INPT2_2, and INPTC_2 are not changed since the voltage level of the first reference voltage (VREF1) node is not changed, a change in the amounts of current flowing through the second input current paths INPT2_1, INPT2_2, and INPTC_2 leads to a change in the amount of the current flowing through the detected voltage (BUF_OUT) output terminal.

For example, where the voltage level of the internal voltage (VINT) node rises higher than the voltage level of the first reference voltage (VREF1) node and the magnitudes of the current flowing through the first input current paths INPT1_1, INPT1_2, and INPTC_1 increase, and accordingly, the amounts of the current flowing through the first output current path OUTPT_1 and the second output current path OUTPT_2 increase, the amount of current flowing through the detected voltage (BUF_OUT) output terminal also increases to raise the voltage level of the first pull-down driving node PD_DRVND1 or the first pull-up driving node PU_DRVND1. If the voltage level of the first pull-down driving node PD_DRVND1 or the first pull-up driving node PU_DRVND1 is raised in this way, the internal voltage driving block 540 pull-down drives the internal voltage (VINT) node to lower the voltage level of the internal voltage (VINT) node. The simultaneous raise in the voltage levels of the first pull-down driving node PD_DRVND1 and the first pull-up driving node PU_DRVND1 result from the operations of the driving node level determination unit 504. Since the detailed operations of the driving node level determination unit 504 were described above, further description thereof will be omitted.

Conversely, where the voltage level of the internal voltage (VINT) node falls lower than the voltage Level of the first reference voltage (VREF1) node and the magnitudes of the current flowing through the first input current paths INPT1_1, INPT1_2, and INPTC_1 decrease and accordingly the amounts of the current flowing through the first output current path OUTPT_1 and the second output current path OUTPT_2 decrease, the amount of current flowing through the detected voltage (BUF_OUT) output terminal also decreases to lower the voltage level of the first pull-down driving node PD_DRVND1 or the first pull-up driving node PU_DRVND1. If the voltage level of the first pull-down driving node PD_DRVND1 or the first pull-up driving node PU_DRVND1 is lowered in this way, the internal voltage driving block 540 pull-up drives the internal voltage (VINT) node to raise the voltage level of the internal voltage (VINT) node. The simultaneous lowering in the voltage levels of the first pull-down driving node PD_DRVND1 and the first pull-up driving node PU_DRVND1 result from the operations of the driving node level determination unit 504. Since the detailed operations of the driving node level determination unit 504 were described above, further description thereof will be omitted.

For reference, the first output current path OUTPT_1 and the second output current path OUTPT_2 were described as connected to the detected voltage output section 5024 in current mirror types as shown in FIG. 5B, this configuration represents one exemplary embodiment. When the magnitudes of the current flowing through the first output current path OUTPT_1 and the second output current path OUTPT_2 are the same with each other, the aforementioned operations may be realized by using only one output current path. In spite of this fact, for stable operations of the voltage detection unit 502, a configuration such that the first output current path OUTPT_1 and the second output current path OUTPT_2 are connected to the detected voltage output section 5024 in current mirror types as shown in FIG. 5B may be advantageous.

As is apparent from the above descriptions, according to the embodiments of the present invention, since the internal voltage generation circuit of a semiconductor memory device operates in a state in which a dead zone region does not exist, the internal voltage generation circuit of a semiconductor memory device may always operate regardless of voltage level variations of an internal voltage.

Therefore, the internal voltage generation circuit may operate with a high reaction speed with respect to the voltage level variations of the internal voltage.

Due to this fact, the voltage level variations of the internal voltage generated by the internal voltage generation circuit may be reduced.

As a consequence, operations of a semiconductor device, which performs designated tasks using the internal voltage, may be stabilized.

While the present invention has been described with respect to the specific embodiments, it will be apparent to those skilled in the art that various changes and modifications may be made without departing from the spirit and scope of the invention as defined in the following claims.

For example, the logic gates and the transistors exemplified in the aforementioned embodiments may be realized to have different positions and kinds depending upon the polarities of the signals inputted thereto.

What is claimed is:

1. A semiconductor device comprising:
    an internal voltage input buffer configured to determine voltage levels of a pull-up driving node and a pull-down driving node as a result of a comparison between a voltage level of an internal voltage node and a voltage level of a reference voltage node such that the pull-up driving node and the pull-down driving node to maintain a voltage level difference;
    an internal voltage driving block configured to pull-up drive the internal voltage node in response to the voltage level of the pull-up driving node and pull-down drive the internal voltage node in response to the voltage level of the pull-down driving node; and
    a current sourcing block connected to the pull-up driving node in a current mirror type with respect to the internal voltage driving block and configured to provide a source current to the internal voltage node, wherein an amount of current provided by the current sourcing block is N times (N is an integer greater than 1) larger than an amount of current provided to the internal voltage node by the internal voltage driving block.

2. The semiconductor device of claim 1, further comprising:
    a current sinking block connected to the pull-down driving node in a current mirror type with respect to the internal voltage driving block and configured to allow current to flow from the internal voltage node, wherein an amount of current that flows through the current sinking block is N times larger than an amount of current sunk from the internal voltage node by the internal voltage driving block.

3. The semiconductor device of claim 1, wherein the internal voltage input buffer comprises:
    a voltage detection unit configured to compare the voltage level of the internal voltage node and the voltage level of the reference voltage node; and
    a driving node level determination unit configured to determine the voltage levels of the pull-up driving node and the pull-down driving node in response to an output signal of the voltage detection unit so that the voltage level difference is maintained.

4. The semiconductor device of claim 3, wherein the voltage detection unit comprises:
    a first input section configured to control magnitudes of current that flows through first input current paths in response to the voltage level of the internal voltage node;
    a second input section configured to control magnitudes of current that flows through second input current paths in response to the voltage level of the reference voltage node; and
    a detected voltage output section configured to control a voltage level of a detected voltage in response to a difference between the magnitudes of the current flowing through the first input current paths and the magnitudes of the current flowing through the second input current paths.

5. The semiconductor device of claim 4,
    wherein the first input section controls the magnitudes of the current that flows through the first input current paths in a rail-to-rail type in response to the voltage level of the internal voltage node, and
    wherein the second input section controls the magnitudes of the current that flows through the second input current paths in a rail-to-rail type in response to a voltage level of the reference voltage node.

6. The semiconductor device of claim 5, wherein the detected voltage output section comprises:
    a first output current path connected to a current source in parallel to the first input current paths, wherein the amount of current flowing through the first output current path is controlled according to the magnitudes of the current flowing through the first input current paths; and
    a second output current path connected to the first output current path in a current mirror type, connected to a current source in parallel to the second input current paths, and connected to a detected voltage output terminal such that the magnitudes of the current flowing through the second input current paths and the detected voltage output terminal are controlled according to a magnitude of the current flowing through the first output current path.

7. The semiconductor device of claim 3, wherein the driving node level determination unit comprises:
   a sourcing current source configured to provide current of a first magnitude to the pull-up driving node;
   a sinking current source configured to allow current of the second magnitude to flow from the pull-down driving node; and
   a floating current source configured to allow current of the third magnitude to always flow between the pull-up driving node and the pull-down driving node and change the voltage level of the pull-up driving node or the pull-down driving node by a voltage level variation amount of the pull-down driving node or the pull-up driving node corresponding to an amount of current supplied to the pull-down driving node or the pull-up driving node through an output node of the voltage detection unit.

8. The semiconductor device of claim 7, wherein the floating current source comprises:
   an NMOS transistor including a drain terminal that is connected to the pull-up driving node, a source terminal that is connected to the pull-down driving node, and a gate terminal having a first bias voltage supplied thereto, and configured to operate in a saturated state; and
   a PMOS transistor having a source terminal that is connected to the pull-up driving node, a drain terminal that is connected to the pull-down driving node, and a gate terminal having a second bias voltage supplied thereto, and configured to operate in a saturated state.

9. The semiconductor device of claim 1, further comprising:
   a second internal voltage input buffer configured to determine a voltage level of a second pull-up driving node by comparing the voltage level of the internal voltage node and a voltage level of a second reference voltage node;
   a third internal voltage input buffer configured to determine a voltage level of a second pull-down driving node by comparing the voltage level of the internal voltage node and a voltage level of a third reference voltage node; and
   a second internal voltage driving block configured to pull-up drive the internal voltage node in response to the voltage level of second pull-up driving node, and pull-down drive the internal voltage node in response to the voltage level of the second pull-down driving node.

10. A semiconductor device comprising:
    a first internal voltage input buffer configured to determine voltage levels of a first pull-up driving node and a first pull-down driving node by comparing a voltage level of an internal voltage node and a voltage level of a first reference voltage node such that the first pull-up driving node and the first pull-down driving node maintain a voltage level difference;
    a second internal voltage input buffer configured to determine a voltage level of a second pull-up driving node by comparing the voltage level of the internal voltage node and a voltage level of a second reference voltage node;
    a third internal voltage input buffer configured to determine a voltage level of a second pull-down driving node by comparing the voltage level of the internal voltage node and a voltage level of a third reference voltage node; and
    an internal voltage driving block configured to pull-up drive the internal voltage node in response to the respective voltage levels of the first pull-up driving node and the second pull-up driving node and pull-down drive the internal voltage node in response to the respective voltage levels of the first pull-down driving node and the second pull-down driving node.

11. The semiconductor device of claim 10,
    wherein the voltage level of the second reference voltage node is lower than the voltage level of the third reference voltage node, and
    wherein the voltage level of the first reference voltage node is higher than the voltage level of the second reference voltage node and lower than the voltage level of the third reference voltage node.

12. The semiconductor device of claim 10, wherein the first internal voltage input buffer comprises:
    a voltage detection unit configured to compare the voltage level of the internal voltage node and the voltage level of the first reference voltage node; and
    a driving node level determination unit configured to determine the voltage levels of the first pull-up driving node and the first pull-down driving node in response to an output signal of the voltage detection unit so that the voltage level difference is maintained.

13. The semiconductor device of claim 12, wherein the voltage detection unit comprises:
    a first input section configured to control magnitudes of current that flows through first input current paths in response to the voltage level of the internal voltage node;
    a second input section configured to control magnitudes of current that flows through second input current paths in response to the voltage level of the first reference voltage node; and
    a detected voltage output section configured to control a voltage level of a detected voltage in response to a difference between the magnitudes of the current flowing through the first input current paths and the magnitudes of the current flowing through the second input current paths.

14. The semiconductor device of claim 13,
    wherein the first input section controls the magnitudes of the current that flows through the first input current paths in a rail-to-rail type in response to the voltage level of the internal voltage node, and
    wherein the second input section controls the magnitudes of the current that flows through the second input current paths in a rail-to-rail type in response to a voltage level of the first reference voltage node.

15. The semiconductor device of claim 14, wherein the detected voltage output section comprises:
    a first output current path connected to a current source in parallel to the first input current paths, wherein the amount of current flowing through the first output current path is controlled according to the magnitudes of the current flowing through the first input current paths; and
    a second output current path connected to the first output current path in a current mirror type, connected to a current source in parallel to the second input current paths, and connected to a detected voltage output terminal such that the magnitudes of the current flowing through the second input current paths and the detected voltage output terminal are controlled according to a magnitude of the current flowing through the first output current path.

16. The semiconductor device of claim 12, wherein the driving node level determination unit comprises:
    a sourcing current source configured to provide current of a first magnitude to the first pull-up driving node;

a sinking current source configured to allow current of the second magnitude to flow from the first pull-down driving node; and a floating current source configured to allow current of the third magnitude to always flow between the first pull-up driving node and the first pull-down driving node, and change the voltage level of the first pull-up driving node or the first pull-down driving node by a voltage level variation amount of the first pull-down driving node or the first pull-up driving node corresponding to an amount of current supplied to the first pull-down driving node or the first pull-up driving node through an output node of the voltage detection unit.

17. The semiconductor device of claim 16, wherein the floating current source comprises:

an NMOS transistor including a drain terminal that is connected to the first pull-up driving node, a source terminal that is connected to the first pull-down driving node, and a gate terminal having a first bias voltage supplied thereto, and configured to operate in a saturated state; and a PMOS transistor including a source terminal that is connected to the first pull-up driving node, a drain terminal that is connected to the first pull-down driving node, and a gate terminal having a second bias voltage supplied thereto, and configured to operate in a saturated state.

18. A method for operating a semiconductor device, comprising:

raising simultaneously voltage levels of a pull-up driving node and a pull-down driving node in response to a voltage level of an internal voltage node that becomes higher than a level of a reference voltage node such that a voltage level difference is maintained;

lowering simultaneously the voltage levels of the pull-up driving node and the pull-down driving node in response to the voltage level of the internal voltage node that becomes lower than the level of the reference voltage node such that the voltage level difference is maintained;

pull-up driving the internal voltage node with a driving force in response to the voltage level of the pull-up driving node;

pull-down driving the internal voltage node with the driving force in response to the voltage level of the pull-down driving node;

pull-up driving the internal voltage node with a driving force N times larger than the driving force in response to the voltage level of the pull-up driving node, wherein N is an integer greater than 1; and pull-down driving the internal voltage node with the driving force N times larger than the driving force in response to the voltage level of the pull-down driving node.

19. A method for operating a semiconductor device, comprising:

changing simultaneously voltage levels of a first pull-up driving node and a first pull-down driving node by comparing a voltage level of an internal voltage node and a voltage level of a first reference voltage node such that a voltage level difference is maintained;

changing a voltage level of a second pull-up driving node by comparing the voltage level of the internal voltage node and a voltage level of a second reference voltage node;

changing a voltage level of a second pull-down driving node by comparing the voltage level of the internal voltage node and a voltage level of a third reference voltage node;

pull-up driving the internal voltage node in response to the voltage levels of the first and second pull-up driving nodes; and pull-down driving the internal voltage node in response to the voltage levels of the first and second pull-down driving nodes.

20. The method of claim 19, wherein the voltage level of the second reference voltage node is lower than the voltage level of the third reference voltage node, and wherein the voltage level of the first reference voltage node is higher than the voltage level of the second reference voltage node and lower than the voltage level of the third reference voltage node.

* * * * *